US009527728B2

(12) United States Patent
Romig et al.

(10) Patent No.: US 9,527,728 B2
(45) Date of Patent: Dec. 27, 2016

(54) INTEGRATED CIRCUIT PACKAGE AND METHOD

(71) Applicant: Texas Instruments Incorporated, Dallas, TX (US)

(72) Inventors: Matthew David Romig, Richardson, TX (US); Marie-Solange Anne Milleron, Paris (FR); Benjamin Michael Sutton, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 28 days.

(21) Appl. No.: 13/947,235

(22) Filed: Jul. 22, 2013

(65) Prior Publication Data

US 2015/0021721 A1     Jan. 22, 2015

(51) Int. Cl.
*H01L 29/49*     (2006.01)
*B81C 1/00*     (2006.01)
*H03H 3/007*     (2006.01)

(52) U.S. Cl.
CPC ........ *B81C 1/00269* (2013.01); *H03H 3/0076* (2013.01); *B81C 2203/0118* (2013.01); *B81C 2203/0154* (2013.01)

(58) Field of Classification Search
CPC .................... B81C 1/00269; H03H 3/0076
USPC ......... 257/415, 124, E23.128, E21.599, 778, 257/E29.324
See application file for complete search history.

(56) References Cited

U.S. PATENT DOCUMENTS

| 5,525,839 | A  | * | 6/1996 | Shu ................... H01L 23/3135 257/780 |
| 6,503,847 | B2 |   | 1/2003 | Chen et al. |
| 2004/0201090 | A1 | * | 10/2004 | Aigner et al. ................ 257/686 |
| 2006/0086188 | A1 | * | 4/2006 | Avramescu et al. ........... 73/700 |
| 2008/0185692 | A1 | * | 8/2008 | Salzman ....................... 257/659 |
| 2009/0289722 | A1 | * | 11/2009 | Dropmann et al. .......... 330/303 |
| 2010/0244161 | A1 | * | 9/2010 | Tabrizi ........................... 257/415 |

* cited by examiner

*Primary Examiner* — Michael Shingleton
(74) *Attorney, Agent, or Firm* — Kenneth Liu; Charles A. Brill; Frank D. Cimino

(57) ABSTRACT

A method of forming a packaged electronic device includes fabricating a MEMS structure, such as a BAW structure, on a first semiconductor wafer substrate; forming a cavity in a second semiconductor wafer substrate; and mounting the second substrate on the first substrate such that the MEMS structure is positioned inside the cavity in the second substrate. A wafer level assembly and an integrated circuit package are also described.

20 Claims, 4 Drawing Sheets

INTEGRATED CIRCUIT PACKAGE AND METHOD

BACKGROUND

Microelectromechanical systems (MEMS) is the technology of very small devices, typically within a size range of about 1 µm to 1 mm. MEMS devices are produced with semiconductor fabrication technology. There are currently many types of MEMS devices used in many different applications, for example, microphones, pressure sensors, and mechanical resonators.

One common type of MEMS device is a BAW (Bulk Acoustic Wave) filter. BAW filters are electromechanical devices that can be implemented as ladder or lattice filters. BAW filters typically operate at frequencies from around 2 to around 16 GHz, and may be smaller or thinner than equivalent SAW filters. The two main variants of BAW filters are Thin Film Bulk Acoustic Resonator or FBAR and Solid Mounted Bulk Acoustic Resonator or SMR. BAW filters are frequently used in wireless applications. Various methods of designing and making BAW filters are known in the art. BAW filters are typically implemented at the "wafer level." Identical BAW structures are formed on a large semiconductor substrate (wafer) that is subsequently cut (singulated) into identical separate dies (dice).

DETAILED DESCRIPTION

In this specification directional terms such as up, down, vertical, lateral and the like are used in a relative sense to describe the relationship between objects, parts, surfaces, etc., usually with reference to a drawing figure. Such terms, unless expressly indicated otherwise, do not indicate any particular orientation of the object being described with respect to the earth.

Figure 6:
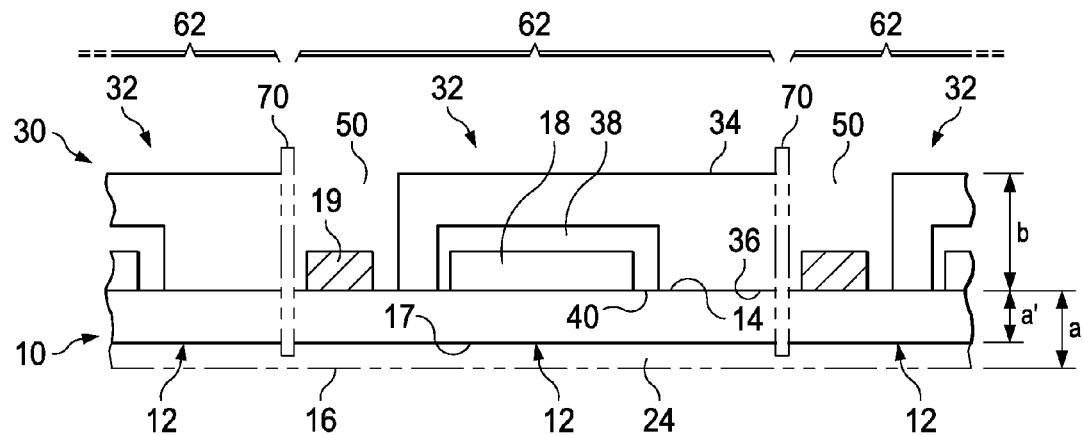
FIG. 6 is a cross sectional elevation view similar to FIG. 5, but with a thinned first semiconductor wafer and showing saw streets.

This specification, in general, discloses a wafer level assembly that includes, as best illustrated by FIG. 6, a first semiconductor wafer substrate 10 having a top surface 14 and a bottom surface 16 (17 after thinning) with a BAW structure 18 formed on the top surface 14. The assembly includes a second semiconductor wafer substrate 30 having a top surface 34 and a bottom surface 36 and having a cavity 38 with an opening 40 in the bottom surface 36. The bottom surface 36 of the second substrate 30 is attached to the top surface 14 of the first substrate 10 and the BAW structure 18 is positioned inside a cavity 38.

Figure 9:
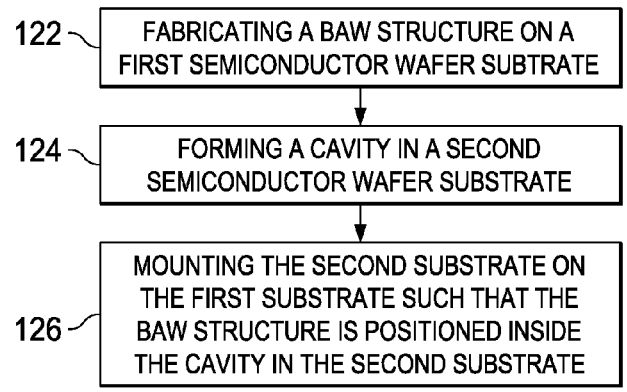
FIG. 9 is a flow chart of a method of forming a wafer level package.

Also, this specification, in general, discloses, as illustrated by FIG. 9 a method of forming a wafer level package. The method includes, as shown at block 122, fabricating a BAW structure on a first semiconductor wafer substrate. The method also includes, as shown at block 124, forming a cavity in a second semiconductor wafer substrate. As shown at block 126, the method further includes mounting the second substrate on the first substrate such that the BAW structure is positioned inside the cavity in the second substrate.

Having thus generally described a wafer level assembly embodiment and a method of forming a wafer level package, details thereof and various embodiments of such assemblies and methods will now be described in detail.

Figure 1:
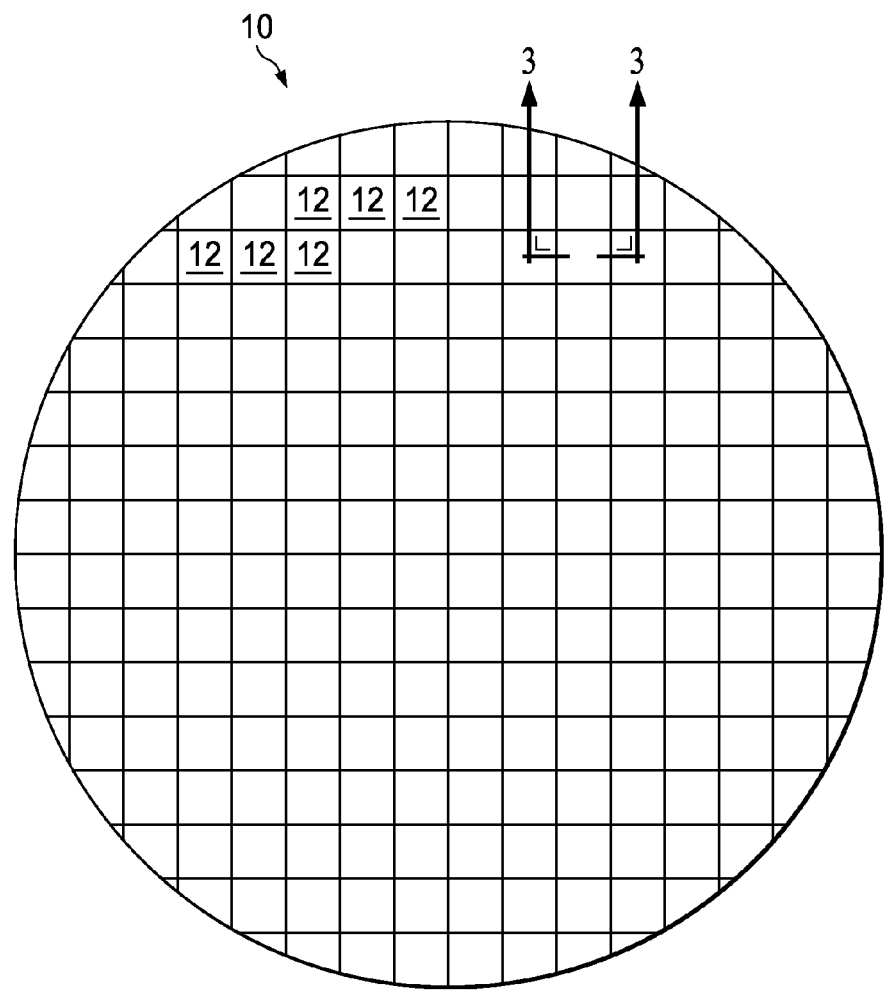
FIG. 1 is a top plan view of a first semiconductor wafer.
Figure 2:
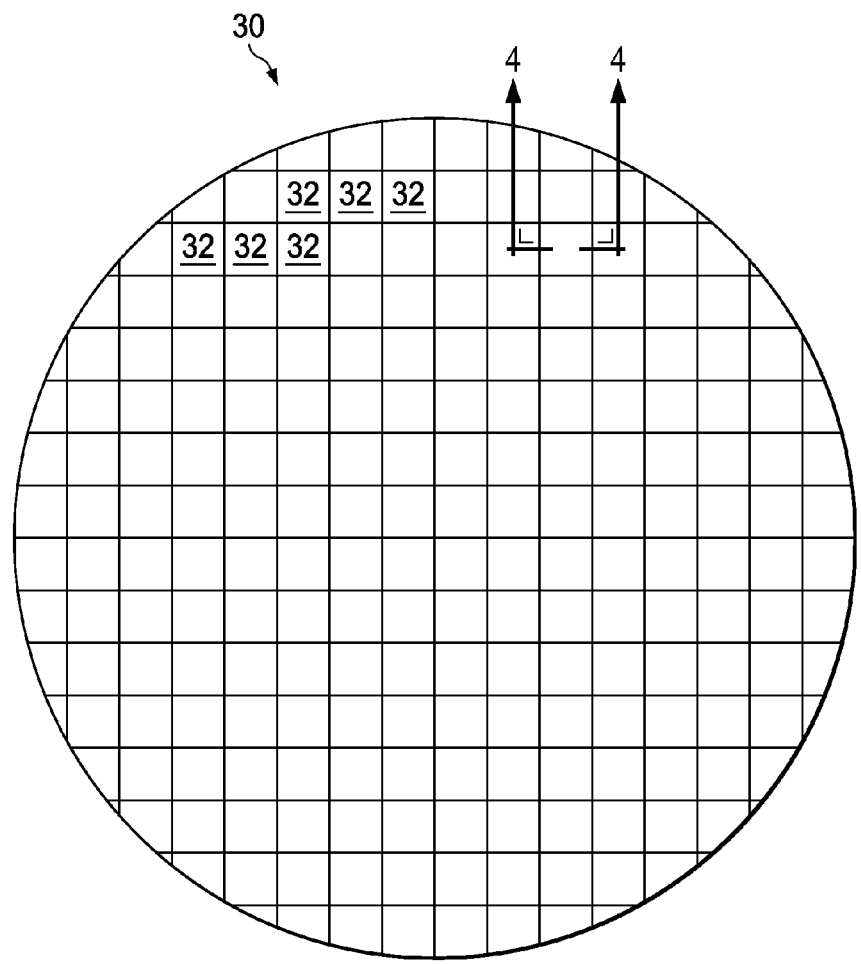
FIG. 2 is a top plan view of a second semiconductor wafer.

FIG. 1 illustrates a first semiconductor wafer 10. The wafer has a plurality of identical, integrally connected wafer portions 12 that each contain identical structure and circuitry. These identical portions 12 are later separated in a die forming process. FIG. 2 is a top plan view of a second wafer 30 which also has a plurality of identical, integrally interconnected wafer portions 32.

Figure 3:
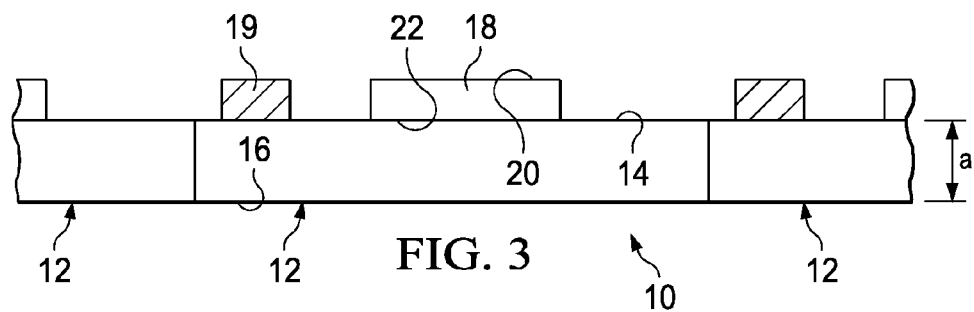
FIG. 3 is a detail cross sectional elevation view of a portion of the first semiconductor wafer showing the location of a BAW structure and bond pad.

FIG. 3 is a detail cross sectional view of a portion of wafer 10. Wafer 10 has a generally flat top surface 14 and a generally flat bottom surface 16. A MEMS structure, such as bulk acoustic wave structure ("BAW") 18, has been formed at the top of the wafer 10, as by conventional processes well known in the art. BAW structure 18 has a top surface 20 and a bottom surface 22. The bottom surface 22 interfaces with and is integrally connected to the wafer top surface 14. A bond pad 19 is formed on top surface 14 adjacent to the BAW structure 18. The first wafer 10 has an initial thickness "a". Thickness "a" is typically in a range of between 400 µm and 1000 µm.

Figure 4:
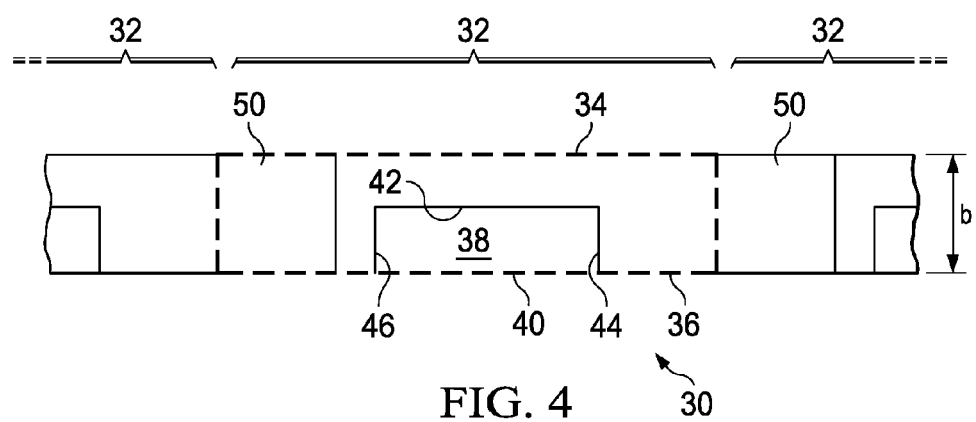
FIG. 4 is a detail cross sectional elevation view of a portion of the second semiconductor wafer showing a cavity and void formed therein.

FIG. 4 is a detail cross sectional view of a portion of the second wafer 30 including wafer portions 32, which are later separated in a die forming process. The original configuration of one of the wafer portions 32, prior to etching operations, is illustrated in dash lines in FIG. 4. The second wafer 30 has a generally flat top surface 34 and a generally flat bottom surface 36 A cavity 38 having a generally rectangular cross section is formed in the second wafer 30 as by etching bottom surface 36. The cavity 38 has a cavity opening 40. Cavity side walls 44, 46 extend generally perpendicular to a generally flat cavity top wall surface 42. A lateral void 50 may also be formed on the second wafer 30. The void 50 may be formed within each wafer portion 32 such that it completely eliminates an entire lateral section of each wafer portion 32. The second wafer 30 may have a height "b" which is typically in a range of between about 200 µm and 1000 µm.

Figure 5:
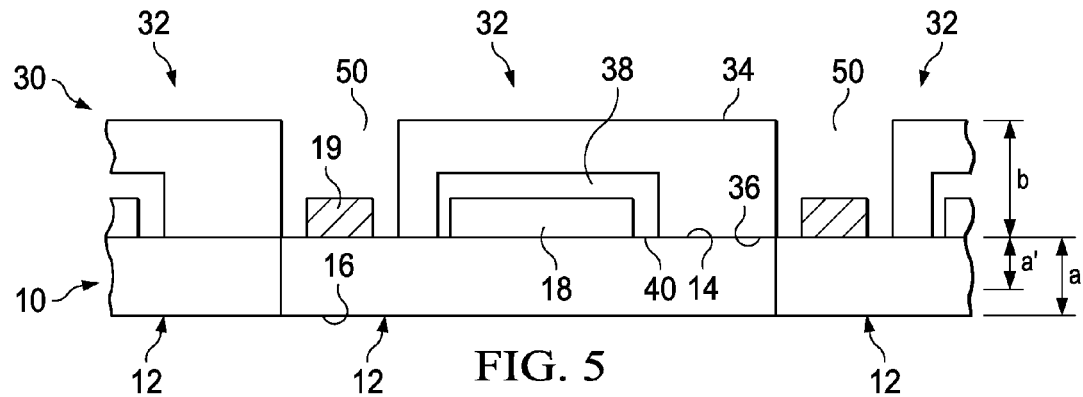
FIG. 5 is a detail cross sectional elevation view showing portions of the second semiconductor wafer mounted on portions of the first semiconductor wafer.

In FIG. 5, the second wafer 30 has been mounted on top the first wafer 10 with integrally connected second wafer portions 32 positioned directly above integrally connected first wafer portions 12. When thus situated, the BAW structure 18 on the first wafer 10 is positioned inside the cavity 38 of the second wafer 30. This attachment process may be done in a controlled environment such as a vacuum or a controlled gas environment such as nitrogen, in order to carefully control the contents of the cavity 38. Also, the die pad 19 on the first wafer 10 is positioned within the lateral void 50 of the second wafer 30 and is thus exposed. The generally flat bottom surface 36 of the second wafer 30 interfaces with the top surface 14 of the first wafer 10. The two surfaces are fixedly attached as by a wafer-to-wafer bonding process, which joins the dielectric portions of the wafers. This attachment process, in one embodiment, does not include any electrical interconnect. There are many available methods known in the art to perform such bonding. See, for example, U.S. Pat. No. 6,603,847 of Yu Chen, et al. issued Jan. 7, 2003, which is hereby incorporated by reference for all that it discloses. In one method embodiment, the assembly shown in FIG. 5 is formed prior to a thinning operation that is performed on the bottom surface 16 of the first wafer 10. The thickness and configuration of the attached second wafer 30 helps to stabilize the first wafer 10 while it is being thinned.

FIG. 6 illustrates the assembly shown in FIG. 5 after a thinning operation. The position of the original bottom surface 16 of the first wafer 10 is illustrated in dash lines in FIG. 6. The first wafer 10 has been thinned as by either or both of mechanically grinding and chemically etching surface 16 to provide a new bottom surface 17. The height "a'" of the thinned first wafer 10 may be from about 50 μm to 400 μm. The new surface 17 may also be a generally planar surface. This thinning process may take place either before or after the first and second wafers 10, 12 are attached. However, as mentioned above, when the second wafer 30 is attached to the first wafer 10 before thinning, it stabilizes the first wafer 10 during thinning. After thinning the height a' of the first wafer 10 may be less than the height "b" of the second wafer 30, for example, it may be between about 100 μm to 400 μm thick. Thinning a wafer to such a low thickness presents challenges, which may include warping and/or cracking. Therefore the second wafer 30 may be designed in a way, as illustrated by FIGS. 5 and 6, which provides mechanical stability during the process of thinning the first wafer 10 to the desired thickness. For example, the ratio of the attached area of the second wafer 30 to the total top surface area of the first wafer 10 may be between about 25% and 75%; the ratio of the thickness of the second wafer 30 to the thickness of the first wafer 10 may be between about 1:2 and 3:1 before grinding and between about 3:1 and 10:1 after grinding; and the total thickness of the combined wafers after grinding may be between about 200 μm and 600 μm. Design considerations include which parts of each second wafer portion 32 are to be bonded to first wafer portions 12. Another consideration is the positioning of these connected parts of wafer portions 32 with respect to singulation cuts 70. In the illustrated embodiments, the second wafer 30 may have no circuitry and may be used for forming an enclosure around the BAW structure 18 and for increasing the combined wafer 10/30 thickness for providing mechanical stability during thinning of the first wafer 10.

As illustrated in dash lines in FIG. 6, singulation cuts 70 are made to separate the various portions 12/32 of the attached wafers into rectangular dice 62. The singulation cuts 70 generally follow the rectangular grid saw streets shown in FIGS. 1 and 2. The singulation cuts 70 may be made by saw cutting, punch cutting, stealth laser fracturing or other means. Each of the attached bottom and top wafer portions 12/32 form a separate die 62.

Figure 7:
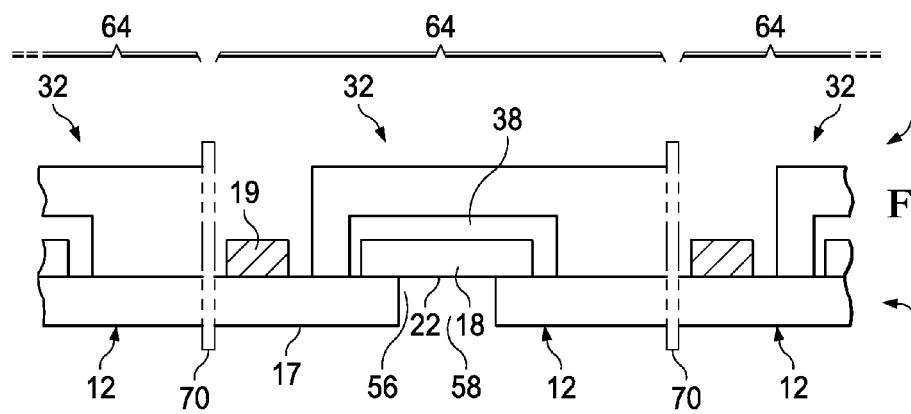
FIG. 7 is a cross sectional elevation view like FIG. 6, except showing a hole formed in a portion of the first semiconductor wafer below the BAW structure.

FIG. 7 shows a second structural embodiment of the combined wafers 10/30, which is identical to that shown in FIG. 4 except that a cavity 56 has been provided below each BAW structure 18 exposing a portion of the BAW bottom surface 22. The cavity 56 may be formed by etching or other means. The cavity 56 has an opening 58 at the lower surface 17 of the first wafer 10. Thus a plurality of dies 64 having a slightly different structure than the dies 62 of FIG. 6 may be provided. The dies 64 may be singulated along saw streets 70.

Figure 8:
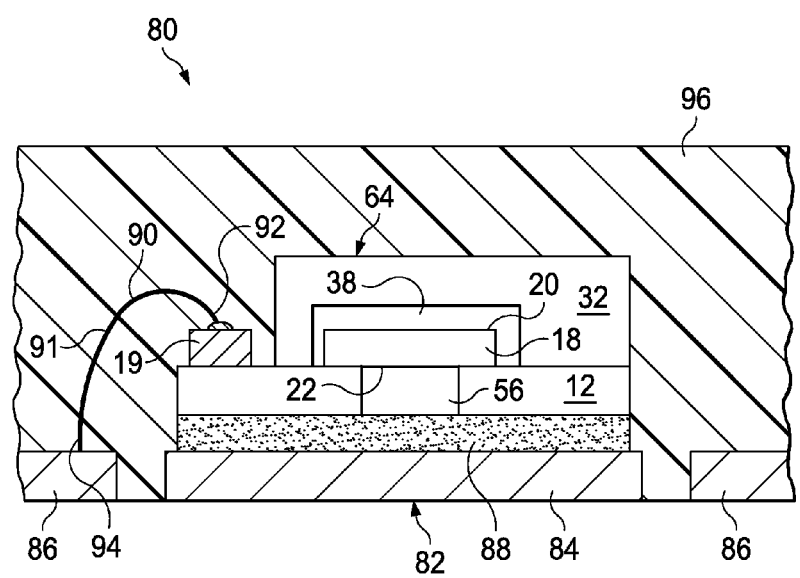
FIG. 8 is a cross sectional elevation view of an integrated circuit package formed using a singulated portion of the two attached semiconductor wafer portions shown in FIG. 7.

As illustrated by FIG. 8, an IC package 80 may be provided by connecting a die such as die 62 or die 64 to a lead frame 82 and encapsulating the die 62 or 64 and the lead frame 82 in a layer of encapsulant 96. In FIG. 8, the lead frame 82 comprises a die attachment pad portion 84 and a plurality of surrounding lead portions 86. A die attachment film 88, such as an epoxy resin filled with a filler material such as silver, may be used to attach the die 64 to the die attachment pad portion 84 of a lead frame 82. This epoxy may be applied using any die attach techniques known in the art, such as dispensing by a needle to the leadframe 82, by film attachment to the back surface 12 of first wafer 10, or by screen printing to leadframe 82 or to first wafer 10. This epoxy may be any suitable material for die attachment to a leadframe, and may have a range of possible chemical formulations, as is known in the art.

A bond wire 90 has a first end 92 that may be welded to the contact pad 19 on the die 62/64 as by a ball bond. A second end 94 of the bond wire 90 may be welded to one of the lead portions 86 by a second weld such as a stitch bond. In one embodiment, the bond wire 90 has a low wire loop 91, which significantly reduces inductance interference in the BAW structure 18. As used herein "low wire loop" means a loop profile that has a height less than the thickness (height) of the associated die 64 so that the overall thickness of the package mold 96 is not limited by the wire loop profile. Loop profiles of 25 to 100 microns can be achieved with traditional ball bonding or with techniques such as "reverse bonding" where a stitch bond is placed on a small ball bond which is first placed on the die. These techniques are well known in the art.

Methods for forming wafer level packages and different embodiments of integrated circuit packages and wafer level assemblies therefor have been described in detail herein. Various alternative embodiments will occur to those skilled in the art after reading this disclosure. For example, multiple bond pads could be provided on each second wafer die 32, multiple bond wires could be connected between each bond pad 19 and lead 86 and various combinations of die pads 19, leads 86 and bond wires 90 could be used. Similarly multiple MEMS structures, such as BAW structures 18 or others, could be provided on each first wafer portion 12 and such multiple MEMS structures could be contained in one or multiple cavities in second wafer portions 32. The appended claims are intended to be broadly construed to cover all such alternative embodiments, except to the extent limited by the prior art.

What is claimed is:

1. An integrated circuit package comprising:
a first semiconductor substrate having a top surface and a bottom surface with a microelectromechanical system (MEMS) structure and at least one a contact pad formed on said top surface, said at least one contact pad being formed over a non-recessed portion of said top surface;
a second semiconductor substrate having a top surface and a bottom surface and having a cavity with an opening in said bottom surface, wherein said bottom surface of said second semiconductor substrate is attached to said top surface of said first semiconductor substrate, and wherein said MEMS structure is positioned inside said cavity and said at least one contact pad is positioned outside said cavity; and a leadframe having a die attachment pad and at least one lead, wherein said first semiconductor substrate is mounted on said die attachment pad and wherein said at least one contact pad is attached by at least one bond wire to said at least one lead.

2. The integrated circuit package of claim 1, wherein said first semiconductor substrate comprises a hole extending therethrough that exposes said MEMS structure.

3. The integrated circuit package of claim 1 further comprising a layer of encapsulant covering said first and second semiconductor substrates, said at least one bond wire, and at least a portion of said leadframe.

4. The integrated circuit package of claim 1 wherein said MEMS structure is a bulk acoustic wave (BAW) filter structure.

5. The integrated circuit package of claim 1, comprising a die attachment film disposed between said die attachment pad and said first semiconductor substrate.

6. The integrated circuit package of claim 5, wherein said die attachment film comprises an epoxy resin having a filler material.

7. The integrated circuit package of claim 1, wherein a ratio of the height of the second semiconductor substrate to the height of the first semiconductor substrate is between approximately 3:1 to 10:1.

8. The integrated circuit package of claim 1, wherein said top surface of the first semiconductor substrate on which said MEMS structure and said at least one contact pad are formed is substantially planar.

9. The integrated circuit package of claim 1, wherein said MEMS structure is formed over a non-recessed portion of said top surface of said first semiconductor substrate.

10. The integrated circuit package of claim 1, wherein said at least one contact pad has an uppermost surface that is not coplanar with the top surface of said first semiconductor substrate.

11. An integrated circuit package comprising:
a die comprising:
  a first semiconductor substrate having a top surface and a bottom surface, wherein the top surface is substantially planar and the first semiconductor substrate comprises a microelectromechanical system (MEMS) structure formed on the top surface; and
  a second semiconductor substrate having a top surface and a bottom surface, wherein the second semiconductor substrate comprises a cavity formed in the bottom surface, wherein the bottom surface of the second semiconductor substrate is attached to the top surface of the first semiconductor substrate to enclose the MEMS structure inside the cavity, and wherein the die has a thickness of less than or equal to approximately 300 µm; and
a leadframe comprising a die attachment pad, wherein the first semiconductor substrate is mounted on the die attachment pad.

12. The integrated circuit package of claim 11, wherein the die comprises a contact pad formed on the top surface of the first semiconductor substrate adjacent to the MEMS structure, and wherein the leadframe comprises a lead, the contact pad being attached to the lead by a bond wire.

13. The integrated circuit package of claim 12, wherein the contact pad is not enclosed within the cavity.

14. The integrated circuit package of claim 11, wherein the die has a thickness of between approximately 200 µm to 300 µm.

15. The integrated circuit package of claim 11, wherein the MEMS structure comprises a bulk acoustic wave (BAW) filter.

16. An integrated circuit die comprising;
a first semiconductor substrate having a top surface and a bottom surface, wherein the top surface is substantially planar;
a second semiconductor substrate having a top surface and a bottom surface, the bottom surface having a cavity formed therein, wherein the bottom surface of the second semiconductor substrate is attached to the top surface of the first semiconductor substrate to form an enclosure defined by the cavity; and
a microelectromechanical system (MEMS) structure formed on the top surface of the first semiconductor substrate and enclosed within the enclosure;
wherein the die has a thickness of less than or equal to approximately 300µm.

17. The integrated circuit die of claim 16, comprising a contact pad formed on the top surface of the first semiconductor substrate, the contact pad not enclosed within the enclosure.

18. The integrated circuit die of claim 16, wherein the die has a thickness of between approximately 200 µm to 300 µm.

19. The integrated circuit die of claim 16, wherein the second semiconductor substrate does not comprise circuitry.

20. The integrated circuit package of claim 1, wherein said at least one bond wire has a low loop configuration.

* * * * *